(12) United States Patent
Lin et al.

(10) Patent No.: US 12,237,362 B2
(45) Date of Patent: Feb. 25, 2025

(54) DISPLAY DEVICE

(71) Applicant: InnoLux Corporation, Miao-Li County (TW)

(72) Inventors: Hsiao-Lang Lin, Miao-Li County (TW); Tsung-Han Tsai, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 447 days.

(21) Appl. No.: 17/568,739

(22) Filed: Jan. 5, 2022

(65) Prior Publication Data

US 2022/0246674 A1 Aug. 4, 2022

(30) Foreign Application Priority Data

Feb. 2, 2021 (CN) .......................... 202110143180.9

(51) Int. Cl.
*H01L 27/15* (2006.01)
*H01L 33/50* (2010.01)

(52) U.S. Cl.
CPC .......... *H01L 27/156* (2013.01); *H01L 33/507* (2013.01)

(58) Field of Classification Search
None
See application file for complete search history.

(56) References Cited

U.S. PATENT DOCUMENTS

| | | |
|---|---|---|
| 2019/0377223 A1 | 12/2019 | Lee |
| 2020/0043976 A1 | 2/2020 | Kim |
| 2020/0081173 A1 | 3/2020 | Tak |
| 2020/0091464 A1 | 3/2020 | Park |
| 2020/0159065 A1 | 5/2020 | Kim |
| 2020/0168668 A1 | 5/2020 | Kim |

FOREIGN PATENT DOCUMENTS

CN 111864035 A * 10/2020 ............... G09F 9/33

* cited by examiner

*Primary Examiner* — Robert K Carpenter
(74) *Attorney, Agent, or Firm* — Winston Hsu

(57) ABSTRACT

A display device including a first substrate structure, a second substrate structure and an adhesive layer is provided by the present disclosure. The first substrate structure includes a first recess. The second substrate structure is disposed opposite to the first substrate structure. The adhesive layer is sandwiched between the first substrate structure and the second substrate structure, wherein a part of the adhesive layer is filled in the first recess.

11 Claims, 8 Drawing Sheets

DISPLAY DEVICE

BACKGROUND OF THE DISCLOSURE

1. Field of the Disclosure

The present disclosure relates to a display device, and more particularly to a display device having a recess design.

2. Description of the Prior Art

In a display device having two substrate structures, when the two substrate structures are aligned with and adhered to each other to form the display device, the glue material for adhering the two substrate structures may be squeezed outward and overflowed during the adhering process, such that the subsequent processes such as the cutting process or the bonding process may be affected, or the amount of the glue material remained between the two substrate structures is too low to achieve effective bonding. Therefore, to reduce the abnormal condition during the adhering process of the two substrate structures is the direction of the development in the related field.

SUMMARY OF THE DISCLOSURE

The present disclosure provides a display device having a recess design, wherein the recess design of the display device may reduce the abnormal conditions during the adhering process of the display device to improve the subsequent processes such as the cutting process or the bonding process, thereby improving the yield of the display device.

In some embodiments, a display device is provided by the present disclosure, wherein the display device includes a first substrate structure, a second substrate structure and an adhesive layer. The first substrate structure includes a first recess. The second substrate structure is disposed opposite to the first substrate structure. The adhesive layer is sandwiched between the first substrate structure and the second substrate structure, wherein a part of the adhesive layer is filled in the first recess.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the electronic device, and certain elements in various drawings may not be drawn to scale. In addition, the number and dimension of each element shown in drawings are only illustrative and are not intended to limit the scope of the present disclosure.

Certain terms are used throughout the description and following claims to refer to particular elements. As one skilled in the art will understand, electronic equipment manufacturers may refer to an element by different names. This document does not intend to distinguish between elements that differ in name but not function.

In the following description and in the claims, the terms "include", "comprise" and "have" are used in an open-ended fashion, and thus should be interpreted to mean "include, but not limited to . . . ".

It will be understood that when an element or layer is referred to as being "disposed on" or "connected to" another element or layer, it can be directly on or directly connected to the other element or layer, or intervening elements or layers may be presented (indirectly). In contrast, when an element is referred to as being "directly on" or "directly connected to" another element or layer, there are no intervening elements or layers presented. When an element or layer is referred to as being "electrically connected" to another element or layer, it can be interpreted as a direct electrical connection or an indirect electrical connection.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

Figure 1:
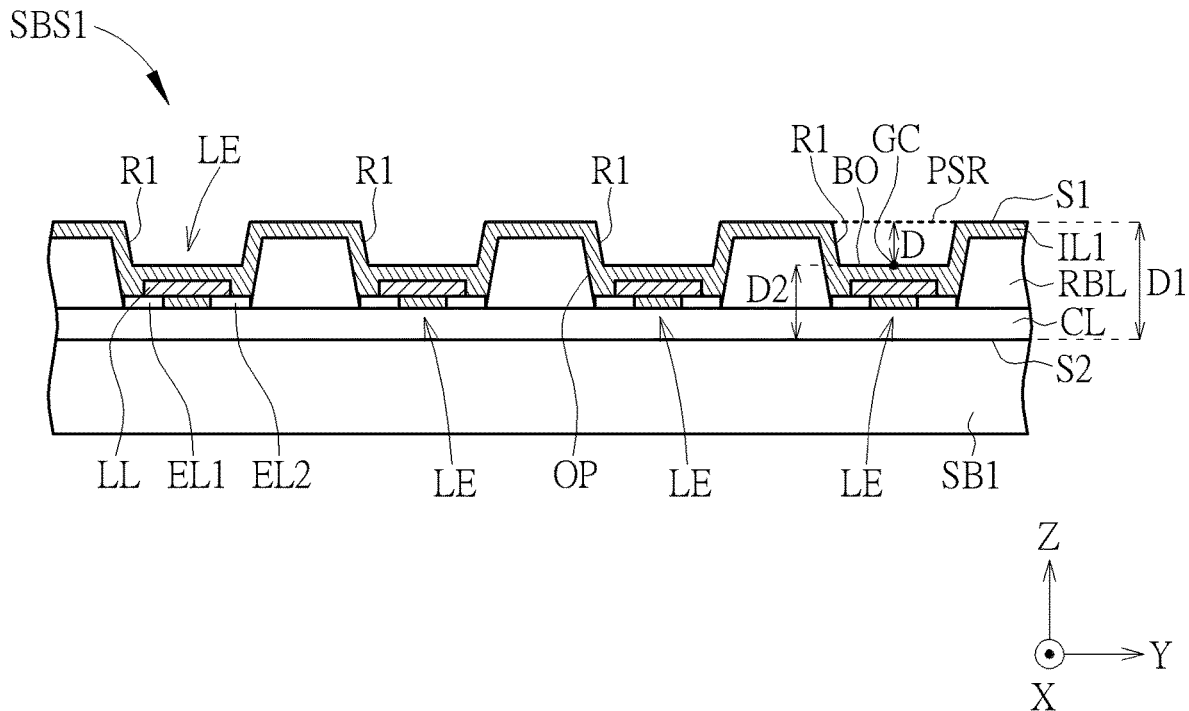
FIG. 1 schematically illustrates a partial cross-sectional view of a first substrate structure of a display device according to a first embodiment of the present disclosure.
Figure 2:
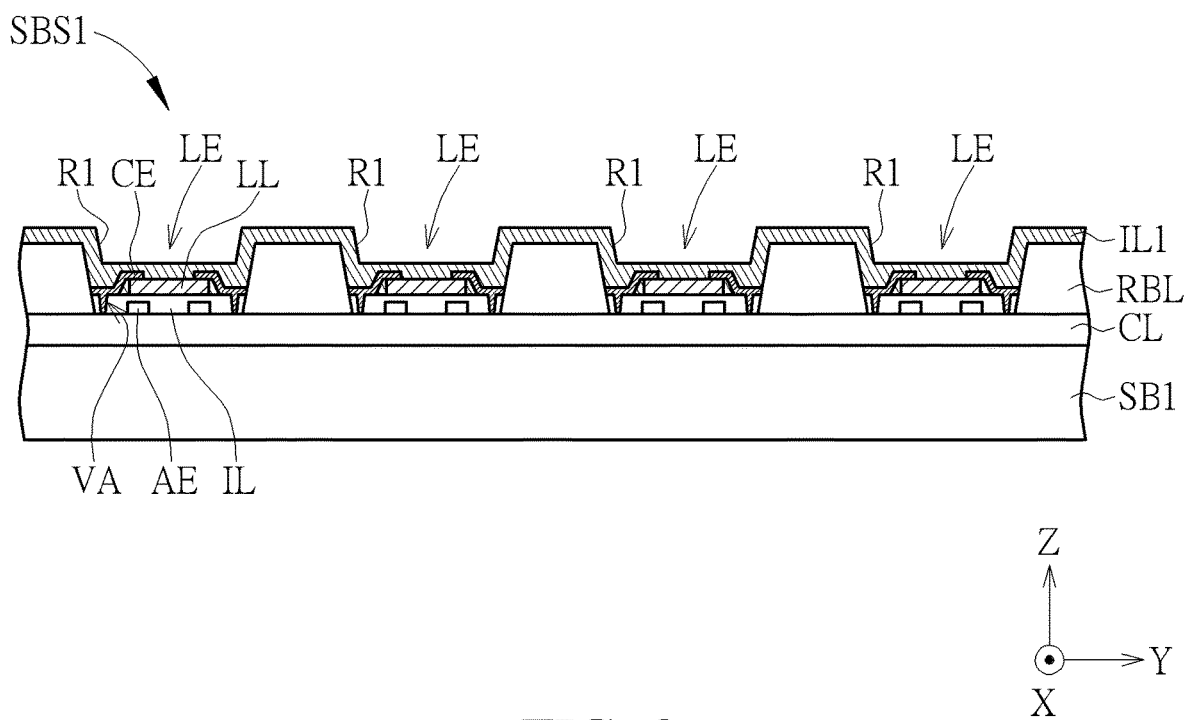
FIG. 2 schematically illustrates a partial cross-sectional view of a first substrate structure of a display device according to a variant embodiment of the first embodiment of the present disclosure.
Figure 3:
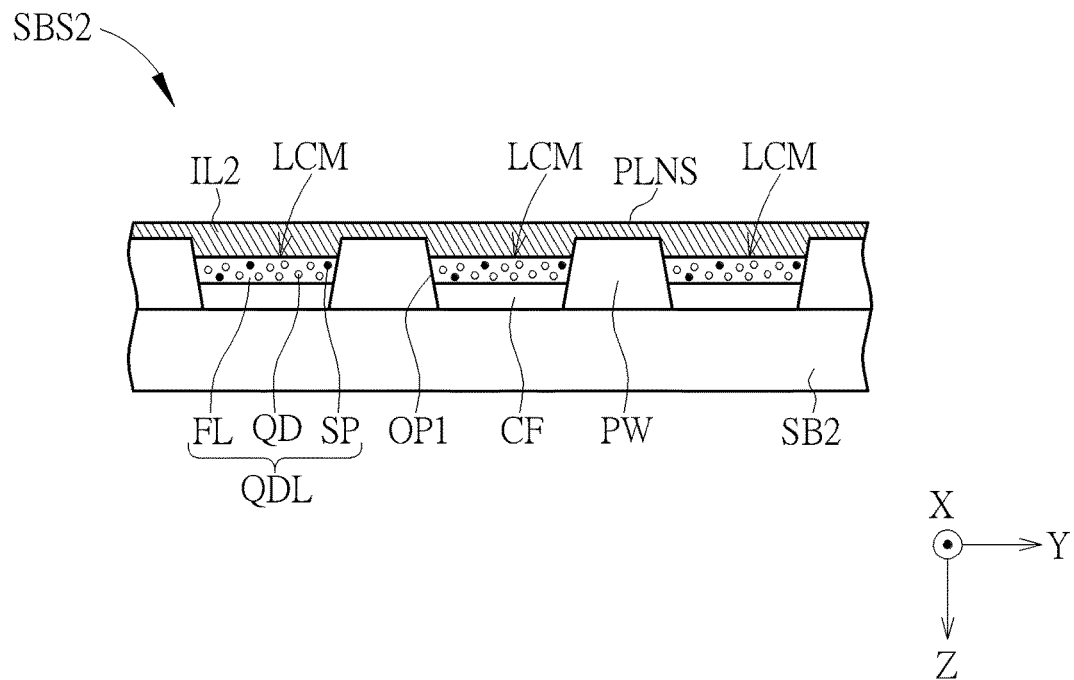
FIG. 3 schematically illustrates a partial cross-sectional view of a second substrate structure of the display device according to the first embodiment of the present disclosure.
Figure 4:
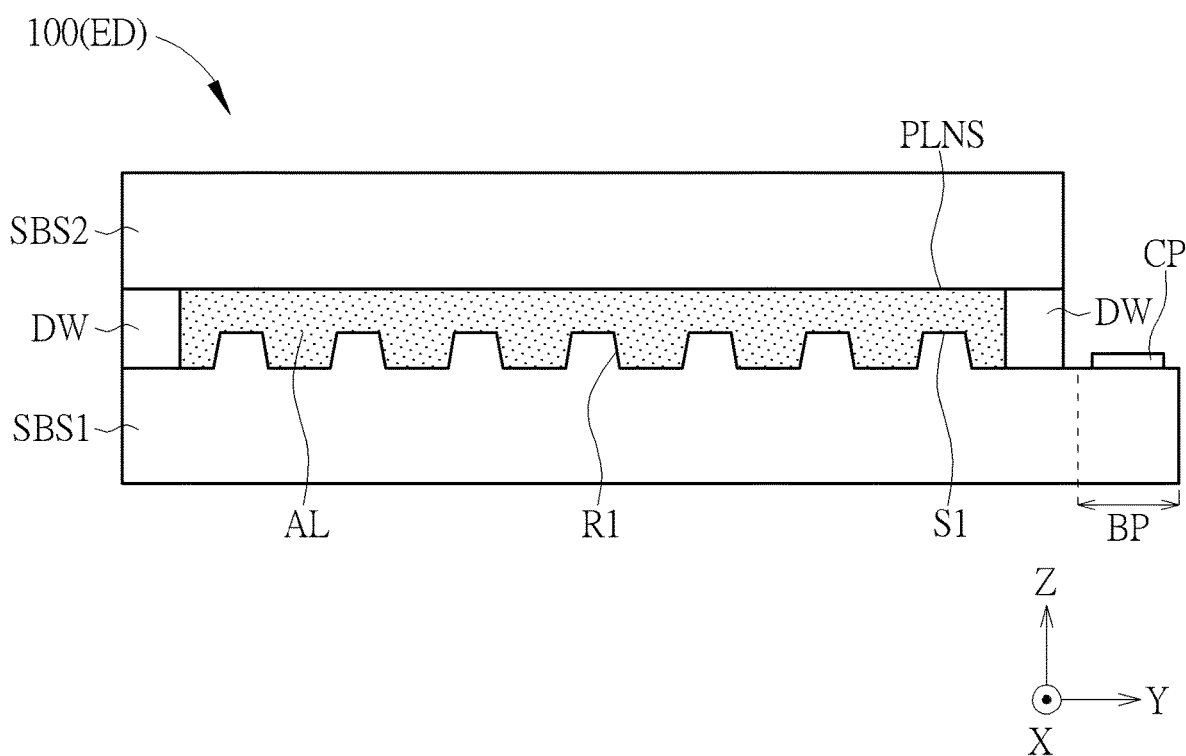
FIG. 4 schematically illustrates a partial cross-sectional view of the display device according to the first embodiment of the present disclosure.

It should be noted that the technical features in different embodiments described in the following can be replaced, recombined, or mixed with one another to constitute another embodiment without departing from the spirit of the present disclosure.

Referring to FIG. 1 to FIG. 4, FIG. 1 schematically illustrates a partial cross-sectional view of a first substrate structure of a display device according to a first embodiment of the present disclosure, FIG. 2 schematically illustrates a partial cross-sectional view of a first substrate structure of a display device according to a variant embodiment of the first embodiment of the present disclosure, FIG. 3 schematically illustrates a partial cross-sectional view of a second substrate structure of the display device according to the first embodiment of the present disclosure, and FIG. 4 schematically illustrates a partial cross-sectional view of the display device according to the first embodiment of the present disclosure. In order to simplify the figure, the first substrate structure SBS1 and the second substrate structure SBS2 are shown as a single layer in FIG. 4, and the detailed structures of the first substrate structure SBS1 and the second substrate structure SBS2 may refer to the structures shown in FIG. 1 to FIG. 3. According to the present embodiment, the electronic device ED shown in FIG. 4 may include a display device 100 displaying static or dynamic images or screens according to the demands and operations of users, but not limited thereto. For example, the display device 100 of the present embodiment may include a self-luminous display device, but not limited thereto. The display device may for example be applied to laptops, common displays, tiled displays, vehicle displays, touch displays, television, surveillance cameras, smart phones, tablets, light source modules, light emitting devices or electronic devices of the above-mentioned products, but not limited thereto. In the following, the display device 100 is taken as an example of the electronic device ED for describing the contents of the present disclosure, but the present disclosure is not limited thereto. As shown in FIG. 4, the display device 100 of the present embodiment may include a first substrate structure SBS1, a second substrate structure SBS2 and an adhesive layer AL, wherein the second substrate structure SBS2 is disposed opposite to the first substrate structure SBS1, and the adhesive layer AL is sandwiched between the first substrate structure SBS1 and the second substrate structure SBS2, but not limited thereto. According to the present embodiment, the adhesive layer AL may be used to adhere the first substrate structure SBS1 to the second substrate structure SBS2 to form the display device 100 of the present embodiment, but not limited thereto. The elements or layers included in the first substrate structure SBS1 and the second substrate structure SBS2 of the present embodiment will be detailed in the following. It should be noted that in the display device 100, when the first substrate structure SBS1 is combined with the second substrate structure SBS2, as shown in FIG. 4, the second substrate structure SBS2 shown in FIG. 3 is aligned with and adhere to the first substrate structure SBS1 in an upside-down manner. That is, the upper surface of the second substrate structure SBS2 shown in FIG. 3 may be regarded as the inner surface of the second substrate structure SBS2 and face downward and toward the first substrate structure SBS1 in FIG. 4, but not limited thereto.

As shown in FIG. 1, the first substrate structure SBS1 of the present embodiment may include a first base substrate SB1, a circuit layer CL, light emitting elements LE, a recess base layer RBL and a first insulating layer IL1, but not limited thereto. According to the present embodiment, the first base substrate SB1 may include a flexible substrate, a rigid substrate or the combinations of the above-mentioned substrates. The material of the flexible substrate may for example include polyimide (PI), polycarbonate (PC), polyethylene terephthalate (PET), other suitable materials or the combinations of the above-mentioned materials. The material of the rigid substrate may for example include glass, ceramic, quartz, sapphire or the combinations of the above-mentioned materials. In addition, although the first base substrate SB1 shown in FIG. 1 is a single-layer structure, the present disclosure is not limited thereto. In some embodiments, the first base substrate SB1 may include a multi-layer structure. The circuit layer CL may be disposed on the first base substrate SB1. For example, the circuit layer CL may be located between the first base substrate SB1 and the light emitting elements LE and/or located between the first base substrate SB1 and the recess base layer RBL. The circuit layer CL may include various kinds of wires, driving circuits and/or driving electronic elements and the insulating layers between the conductive materials. For example, the circuit layer CL may include driving elements (not shown in FIG. 1) for driving the light emitting elements LE to generate light, wherein the driving elements may for example include thin film transistors (TFT), but the present disclosure is not limited thereto.

According to the present embodiment, the recess base layer RBL may be disposed on the first base substrate SB1 and the circuit layer CL, wherein the recess base layer RBL for example can be patterned and may form a plurality of openings OP exposing the circuit layer CL. In detail, the forming method of the recess base layer RBL of the present embodiment may include forming an insulating layer covering the whole circuit layer CL on the circuit layer CL at first. Then, a photolithography and etching process or other suitable processes may be performed to form the openings OP in the insulating layer to expose the circuit layer CL, thereby forming the patterned recess base layer RBL of the present embodiment, but not limited thereto. The recess base layer RBL may include any suitable insulating material, but not limited thereto. It should be noted that the pattern or the shape of the recess base layer RBL shown in FIG. 1 is just exemplary, and the present disclosure is not limited thereto.

According to the present embodiment, the light emitting elements LE may be disposed on the circuit layer CL, and the light emitting elements LE may be driven by the driving elements in the circuit layer CL to generate light. In detail, as shown in FIG. 1, the light emitting elements LE may be disposed corresponding to the first recesses R1. Furthermore, the light emitting elements LE may be disposed in the openings OP formed of the recess base layer RBL, and the light emitting elements LE may be electrically connected to the driving elements in the circuit layer CL, but not limited thereto. In the present embodiment, the light emitting element LE may for example include a light emitting diode, but not limited thereto. The light emitting diode may for example include an organic light emitting diode (OLED), a quantum light-emitting diode (QLED or QDLED), a light emitting diode (LED), other suitable light emitting elements or the combinations of the above-mentioned materials. The light emitting diode may for example include a mini light emitting diode (mini LED) or a micro light emitting diode (micro LED), but not limited thereto. In some embodiments, the chip size of the light emitting diode may range from 300 micrometers (μm) to 10 millimeters (mm), the chip size of the mini light emitting diode may range from 100 micrometers to 300 micrometers, and the chip size of the micro light emitting diode may range from 1 micrometer to 100 micrometers, but not limited thereto. For example, as shown in FIG. 1, the light emitting element LE may for example be a light emitting diode such as a bar type light emitting diode, but not limited thereto. In such condition, the light emitting element LE may for example include a light emitting layer LL and a first electrode EL1 and a second electrode EL2 electrically connected to the light emitting layer LL, wherein the first electrode EL1 and the second electrode EL2 may be electrically connected to the driving elements in the circuit layer CL, and the light emitting layer LL may for example include a p-type semiconductor layer, an active layer and a n-type semiconductor layer, but not limited thereto. In some embodiments, the light emitting element LE may for example include a vertical type light emitting diode and/or a flip type light emitting diode. The methods for connecting the anode electrode or the cathode electrode may be varied according to different shapes (bar-LED, vertical type LED, flip type LED, OLED) of the light emitting layer LL. For example, the electrodes may be connected first or connected later, the present disclosure is not limited thereto. In some embodiments, the light emitting element LE may for example include the organic light emitting diode element, and the light emitting element LE may include any suitable element or layer of the organic light emitting diode element such as an upper electrode, a lower electrode and a light emitting layer disposed between the upper electrode and the lower electrode, but not limited thereto. In the present embodiment, each of the light emitting element LE and the portion of the circuit layer CL corresponding to the light emitting element LE (such as the driving elements for driving the light emitting element LE and other related elements in the circuit layer CL, but not limited thereto) may for example be defined as a pixel or a sub-pixel, wherein the different pixels or sub-pixels may emit light of the same color (such as blue light, but not limited thereto) or emit light of different colors (such as white light, green light and blue light, but not limited thereto), but not limited thereto. Therefore, the recess base layer RBL separating the light emitting elements LE in FIG. 1 may be regarded as a pixel defining layer in the present embodiment, but not limited thereto. It should be noted that although the light emitting elements LE shown in FIG. 1 are all light emitting diode elements of the same type (bar-type light emitting diodes), they are just exemplary, and the present disclosure is not limited thereto. In some embodiments, each of the light emitting elements LE may include any suitable type of light emitting diode element according to the demands of the process. In addition, although FIG. 1 shows a structure in which only one light emitting element LE is disposed in a single opening OP, the present disclosure is not limited thereto. In some embodiments, multiple light emitting elements LE may be disposed in a single opening OP, and the multiple light emitting elements LE may be multiple parallel or multiple serial or multiple bidirectional parallel in the circuit, but not limited thereto. The multiple light emitting elements LE in the single opening OP and the portion of the circuit layer CL corresponding to these light emitting elements LE may for example forma pixel or a sub-pixel, but not limited thereto.

According to the present embodiment, the first insulating layer IL1 may be disposed on the recess base layer RBL and the light emitting elements LE, and the first insulating layer IL1 may cover the recess base layer RBL and the light emitting elements LE, but not limited thereto. That is, the light emitting elements LE may be disposed between the first base substrate SB1 and the first insulating layer IL1 in the present embodiment. It should be noted that the term "cover" mentioned above may be complete cover and partial cover, and the present disclosure is not limited thereto. In detail, as shown in FIG. 1, after the patterned recess base layer RBL and the light emitting elements LE are disposed on the circuit layer CL, the first insulating layer IL1 may be formed on the recess base layer RBL and the light emitting elements LE to form the first substrate structure SBS1 of the present embodiment, but not limited thereto. According to the present embodiment, since the recess base layer RBL may be patterned and form an uneven structure, the first insulating layer IL1 disposed on the recess base layer RBL may have an uneven upper surface, and the level difference of the upper surface of the first insulating layer IL1 may form recesses, but not limited thereto. For example, as shown in FIG. 1, the first insulating layer IL1 may substantially conformally formed on the recess base layer RBL, and after the first insulating layer IL1 is disposed on the uneven recess base layer RBL, it may include an uneven upper surface S1, wherein the positions of the upper surface S1 of the first insulating layer IL1 corresponding to the openings OP of the recess base layer RBL may have first recesses R1, but not limited thereto. That is, the upper surface S1 of the first insulating layer IL1 may form the first recesses R1 corresponding to the openings OP in the present embodiment. In addition, as shown in FIG. 1, the upper surface S1 of the first insulating layer IL1 may be regarded as the inner surface (the upper surface of the first substrate structure SBS1 shown in FIG. 1) of the first substrate structure SBS1. That is, the inner surface of the first substrate structure SBS1 of the present embodiment may include at least one first recess R1, such that the inner surface of the first substrate structure SBS1 may be an uneven surface, but not limited thereto. Moreover, the light emitting elements LE may be disposed in the openings OP in the present embodiment. Therefore, the first recesses R1 corresponding to the positions of the openings OP may correspond to the light emitting elements LE, but not limited thereto. According to the present embodiment, the first insulating layer IL1 may include any suitable organic insulating material, inorganic insulating material or combinations of the above-mentioned materials, but not limited thereto. In addition, although the first insulating layer IL1 is a single-layer structure in FIG. 1, the present disclosure is not limited thereto. In some embodiments, the first insulating layer IL1 may include a composite structure. For example, the first insulating layer IL1 may include a multi-layer structure of inorganic material/organic material/inorganic material, inorganic material/inorganic material/inorganic material or organic material/organic material.

It should be noted that the first substrate structure SBS1 of the present embodiment may further include any suitable element and/or layer in addition to the above-mentioned elements and/or layers, and the present disclosure is not limited thereto. For example, in some embodiments, a buffer layer may for example be disposed between the first base substrate SB1 and the circuit layer CL, but not limited thereto. The features of the first substrate structure SBS1 in the present embodiment may be applied to each of the embodiments and variant embodiments of the present disclosure, and will not be redundantly described in the following.

In addition, the first substrate structure SBS1 of the present disclosure is not limited to what is shown in FIG. 1 and may include other suitable structures. Referring to FIG. 2, FIG. 2 schematically illustrates another embodiment of the first substrate structure SBS1 of the present disclosure. As shown in FIG. 2, the forming method of the first substrate structure SBS1 of the present disclosure may for example include the following steps. First, the first base substrate SB1 is provided, and the circuit layer CL may be formed on the first base substrate SB1. The related descriptions of the first base substrate SB1 and the circuit layer CL may refer to the above-mentioned contents, and will not be redundantly described. Then, the patterned recess base layer RBL and an alignment electrode AE are formed on the circuit layer CL, and an insulating layer IL may be disposed on the circuit layer CL to cover the alignment electrode AE, wherein the alignment electrode AE may include any suitable conductive material, and the insulating layer IL may include any suitable insulating material. The alignment electrode AE mentioned above may be controlled by the circuit layer CL and provide an electromagnetic field for alignment of the light emitting layer LL, wherein the alignment direction of the light emitting layer LL may be arranged toward the direction of the electromagnetic field. In addition, by aligning the positions of the p-type semiconductor layer, the active layer, and the n-type semiconductor layer of the light emitting layer LL at the position of the contact electrode CE to be subsequently connected, the contact electrode CE may provide current to the light emitting layer LL through the circuit layer CL and the via VA to form an electric circuit for emitting light.

Then, the light emitting layer LL may be disposed on the insulating layer IL to form the light emitting element LE, but not limited thereto. As mentioned above, the light emitting layer LL may be electrically connected to the elements (such as thin film transistors, common electrodes, etc., but not limited thereto) in the circuit layer CL through the contact electrode CE. In detail, as shown in FIG. 2, the contact electrode CE may penetrate through the insulating layer IL and form the via VA, and the light emitting layer LL may be electrically connected to the circuit layer CL through the contact electrode CE passing through the insulating layer IL, but not limited thereto. After the light emitting element LE and the contact electrode CE are disposed, the first insulating layer IL1 may be formed subsequently to form the first substrate structure SBS1 of the present disclosure, wherein the level difference of the upper surface of the first insulating layer IL1 may form the first recesses R1, but not limited thereto.

According to the present embodiment, as shown in FIG. 3, the second substrate structure SBS2 may include a second base substrate SB2, a light converting element LCM and a second insulating layer IL2, but not limited thereto. The material of the second base substrate SB2 may refer to the material of the first base substrate SB1, and will not be redundantly described. According to the present embodiment, the light converting element LCM may be disposed on the surface of the second base substrate SB2, wherein the light converting element LCM may include any layer capable of changing the wavelength or color of light. For example, as shown in FIG. 3, the light converting element LCM may include color filters CF and/or quantum dot layers QDL and/or phosphor, but not limited thereto. In some embodiments, the light converting element LCM may include one of the color filter CF and/or the quantum dot layer QDL but not the other one. The quantum dot layer QDL may for example include quantum dots QD to convert the wavelength and/or color of light, but not limited thereto. In some embodiments, the quantum dot layer QDL may further include scattering particles SP in addition to the quantum dots QD, wherein the quantum dots QD and the scattering particles SP are dispersed in the transparent filling layer FL of the quantum dot layer QDL. In some embodiments, the quantum dot layer QDL may only include scattering particles SP dispersed in the transparent filling layer FL. In the present embodiment, the light converting element LCM may for example be spaced apart through light shielding materials. For example, as shown in FIG. 3, the second substrate structure SBS2 may for example include partition walls PW, wherein the partition walls PW may for example define a plurality of openings (such as the opening OP1), and the light converting element LCM may be disposed in the openings defined by the partition walls PW, but not limited thereto. It should be noted that the openings OP1 of the second substrate structure SBS2 in the present embodiment may for example correspond to the openings OP of the above-mentioned first substrate structure SBS1. In other words, the light converting element LCM disposed in the openings OP1 in the second substrate structure SBS2 may correspond to the light emitting elements LE (or pixel/sub-pixel) disposed in the openings OP in the first substrate structure SBS1, such that the light converting element LCM may convert the light emitted by the light emitting elements LE. In addition, in the present embodiment, the light converting element LCM in different openings OP1 may convert the light emitted by the light emitting elements LE to different colors (such as red, green, blue or other suitable colors) of light, but not limited thereto. In some embodiments, when the light emitting elements LE include blue light emitting diodes, the quantum dot layer QDL in the light converting element LCM corresponding to the blue pixel or the blue sub-pixel may for example include scattering particles SP and not include quantum dots, but not limited thereto. According to the present embodiment, as shown in FIG. 3, a second insulating layer IL2 may be disposed on the light converting element LCM and the partition walls PW to cover the light converting element LCM and the partition walls PW, but not limited thereto. That is, the light converting element LCM may be disposed between the second base substrate SB2 and the second insulating layer IL2 in the present embodiment. The material and the structure of the second insulating layer IL2 of the present embodiment may refer to the description of the first insulating layer IL1, and will not be redundantly described. As shown in FIG. 3, the upper surface of the second insulating layer IL2 disposed on the light converting element LCM and the partition walls PW may be a flat surface PLNS in the present embodiment. Since the second insulating layer IL2 may be the uppermost layer of the second substrate structure SBS2, the upper surface of the second insulating layer IL2 may be regarded as the inner surface of the second substrate structure SBS2. That is, the inner surface of the second substrate structure SBS2 may be a flat surface (that is, the flat surface PLNS) in the present embodiment, but not limited thereto. It should be noted that the disposition of the elements and/or the layers of the second substrate structure SBS2 shown in FIG. 3 is just exemplary, and the present disclosure is not limited thereto. In some embodiments, the elements and/or layers of the second substrate structure SBS2 may be disposed in other suitable ways according to the demands of the design. In addition, the elements and/or layers included in the second substrate structure SBS2 of the present embodiment are not limited to what is shown in FIG. 3, and other suitable elements and/or layers may also be included. The features of the second substrate structure SBS2 in the present embodiment may be applied to each of the embodiments and variant embodiments of the present disclosure, and will not be redundantly described in the following.

Referring to FIG. 4, as mentioned above, the display device 100 of the present embodiment may be formed by adhering the first substrate structure SBS1 and the second substrate structure SBS2 with an adhesive layer AL. According to the present embodiment, the adhesive layer AL may include any suitable water glue, such as photo curable water glue, thermosetting water glue or combinations of the above-mentioned water glue, but not limited thereto. The material of the water glue may for example include silicon-based organic material, epoxy-based organic material, epoxy-acrylic-based organic material or other suitable materials, and the composition of acrylic polymer may include butyl acrylate (BA) monomer, acrylic acid (AA) monomer, ethyl acetate (EAC) solvent and 2,2'-Azobis(2-methylpropionitrile) (AIBN) initiator, but not limited thereto. In the present embodiment, when the adhesive layer AL includes photo curable water glue, the exposure energy for photo curing the water glue may for example range from 500 to 5000 millijoules per square centimeters (mJ/cm$^2$) (that is, 500 mJ/cm$^2 \leq$ exposure energy $\leq$ 5000 mJ/cm$^2$); when the adhesive layer AL includes thermosetting water glue, the temperature for thermosetting the water glue may for example range from 70° C. to 120° C. (that is, 70° C.$\leq$ temperature $\leq$ 120° C.), but not limited thereto. In addition, the viscosity of the water glue used as the adhesive layer AL of the present embodiment may for example range from 100 cps to 4500 cps (that is, 100 cps $\leq$ viscosity $\leq$ 4500 cps), but not limited thereto. The description of the material of the adhesive layer AL mentioned above may be applied to each of the embodiments and variant embodiments of the present disclosure, and will not be redundantly described in the following.

Figure 8:
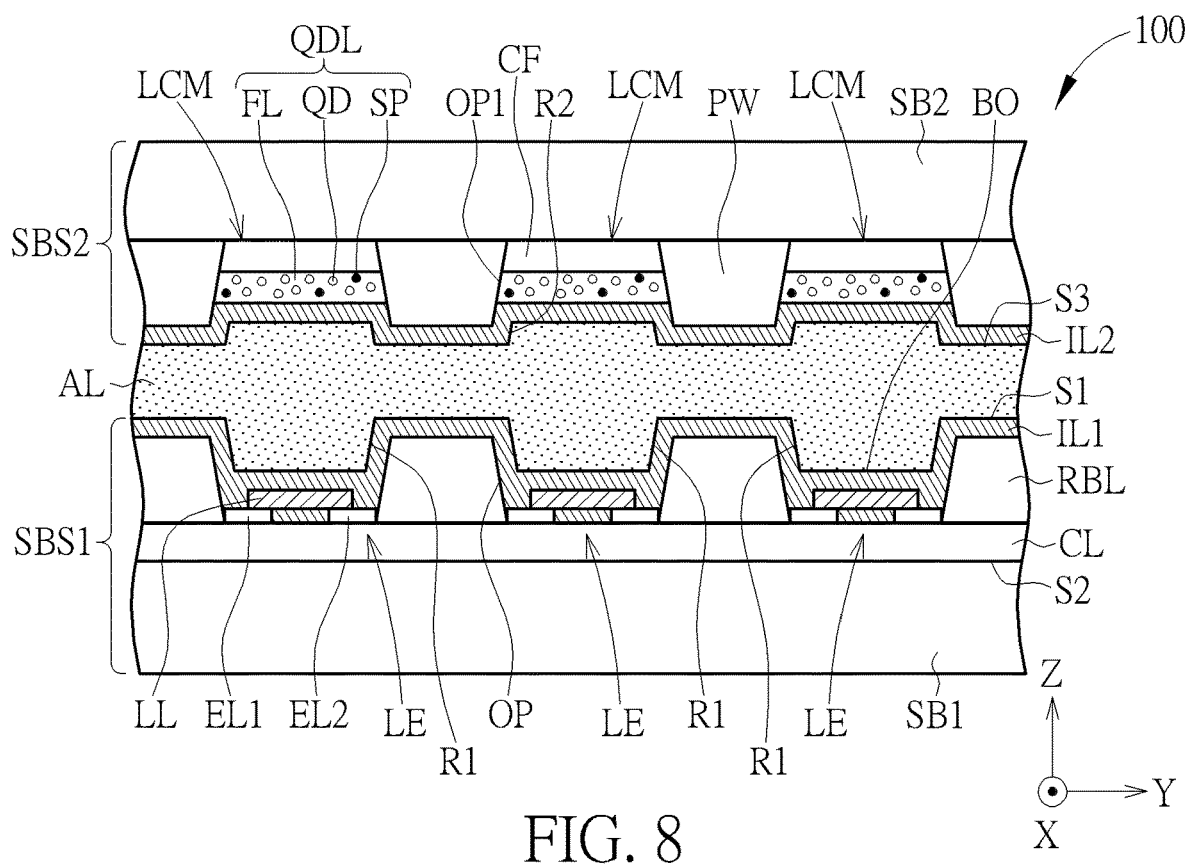
FIG. 8 schematically illustrates a cross-sectional view of a display device according to a third embodiment of the present disclosure.

In the present embodiment, as shown in FIG. 4, since the inner surface (the upper surface S1) of the first substrate structure SBS1 in contact with the adhesive layer AL may include at least one first recess R1, when the first substrate structure SBS1 is adhered to the second substrate structure SBS2, the first recesses R1 on the inner surface (the upper surface S1) of the first substrate structure SBS1 may for example serve as the retarding basin of the adhesive layer AL (or water glue), such that a part of the adhesive layer AL may be filled in the first recesses R1, thereby reducing the condition that the frame glue DW is broken due to squeeze of the adhesive layer AL during the adhering process. "The adhesive layer AL is filled in the first recess R1" mentioned above may include the conditions that the adhesive layer AL is completely filled in the first recess R1 and the adhesive layer AL is filled in a part of the first recess R1, the present disclosure is not limited thereto. In addition, as shown in FIG. 4, the display device 100 may include at least one bonding region BP for electrically connecting the electronic elements and outer elements of the display device 100, wherein the bonding region BP may for example be located on the first substrate structure SBS1, and connecting pads or connecting elements CP may be disposed in the bonding region BP, but not limited thereto. Since the display device 100 of the present disclosure may include the first recesses R1 to reduce the overflow of the adhesive layer AL, the possibility that the cutting process and/or the bonding process of the display device 100 is affected may thereby be reduced, and the yield of the display device 100 may be improved. Moreover, the first recesses R1 may increase the contact area of the adhesive layer AL when the first substrate structure SBS1 is adhered to the second substrate structure SBS2 in the present embodiment, thereby improving the adhesion between the first substrate structure SBS1 and the second substrate structure SBS2. It should be noted that although FIG. 4 shows the structure that the adhesive layer AL is completely filled in the first recesses R1, the present disclosure is not limited thereto. In some embodiments, a part of the first recesses R1 may include the adhesive layer AL, and another part of the first recesses R1 may not include the adhesive layer AL, or, the adhesive layer AL may not be completely filled in some of the first recesses R1. In some embodiments, the adhesive layer AL may be filled in a part of the first recess R1 but not the whole first recess R1. In addition, although it is not shown in FIG. 4, when the first substrate structure SBS1 is adhered to the second substrate structure SBS2, the light emitting elements LE in the first substrate structure SBS1 may for example correspond to the light converting element LCM in the second substrate structure SBS2 (as shown in FIG. 8 below), such that the light converting element may convert the light generated by the light emitting elements LE, but not limited thereto.

According to the present embodiment, the first recess R1 may have a depth, wherein the depth of the first recess R1 may be defined as the vertical distance between a first plane of the first recess R1 to the geometric center of the bottom outline of the first recess R1, and the first plane may for example be the highest virtual horizontal plane of the first recess R1, but not limited thereto. In detail, as shown in FIG. 1, in the cross-sectional view of the first substrate structure SBS1, the cross-section of the first recess R1 may for example have a trapezoidal shape, and the first recess R1 may have a first plane PSR, wherein the first plane PSR may be the highest virtual plane of the first recess R1 (or the first substrate structure SBS1). That is, the first plane PSR is the horizontal plane parallel to the surface of the first base substrate SB1 and pass through the highest point of the side wall or the highest point of the outer edge of the first recess R1, but not limited thereto. The definition of the first plane PSR may be applied to each of the embodiments and variant embodiments of the present disclosure, and will not be redundantly described in the following. As shown in FIG. 4, the first plane PSR of the first recess R1 may for example be coplanar with the upper surface S1 in the present embodiment, but not limited thereto. In addition, the first recess R1 having a trapezoidal shape may for example include an outline BO in the present embodiment, wherein the outline BO of the first recess R1 may include any suitable pattern such as circle, rectangle, polygon, non-regular pattern or other suitable shapes when observing from the top view direction (such as the direction Z) of the first substrate structure SBS1, but the present disclosure is not limited thereto. After the outline BO of the first recess R1 is confirmed through the cross-section of the display device, the geometric center of the outline BO may be defined according to the shape of the outline BO. For example, when the outline BO includes circular shape, the geometric center of the outline BO may be the center of the circle, but not limited thereto. As shown in FIG. 1, the geometric center of the outline BO of the first recess R1 may be exemplarily labeled as the point GC, but not limited thereto. According to the present embodiment, after the first plane PSR of the first recess R1 and the geometric center of the outline BO of the first recess R1 are defined, the vertical distance between the first plane PSR and the geometric center of the outline BO may be defined as the depth D of the first recess R1. That is, the depth D of the first recess R1 may be defined as the vertical distance between the first plane PSR and the point GC shown in FIG. 1. The "vertical" mentioned here may represent the direction perpendicular to the surface of the first base substrate SB1, that is, the direction Z, but not limited thereto. It should be noted that the definition of the depth D of the first recess R1 is not limited to the position of the geometric center of the outline BO of the first recess R1, and the depth D of the first recess R1 may be defined through a point near the geometric center of the outline BO of the first recess R1. For example, in some embodiments, the point GC shown in FIG. 1 may be the point near the geometric center of the outline BO of the first recess R1, but not the geometric center of the outline BO of the first recess R1, wherein the depth D of the first recess R1 may be defined as the vertical distance between the first plane PSR and the point GC, but not limited thereto. In addition, although the shape of the first recess R1 in the cross-sectional view is observed from the cross-sectional view of the first substrate structure SBS1 shown in FIG. 1 in the present embodiment, wherein the cross-section of the first substrate structure SBS1 shown in FIG. 1 is a cross-section parallel to the Y-Z plane, the present disclosure is not limited thereto. In some embodiments, in order to observe the shape of the first recess R1 in a cross-sectional view, the cross-section of the first substrate structure SBS1 may be any cross-section perpendicular to the surface of the first base substrate SB1 (such as the X-Y plane, but not limited thereto). In some embodiments, the cross-section of the first substrate structure SBS1 may be parallel to the extending direction of the wires (such as data lines, scan lines and/or power lines, but not limited thereto) in the first substrate structure SBS1, but not limited thereto. The description about the direction of the cross-section mentioned above may be applied to each of the embodiments and variant embodiments of the present disclosure, and will not be redundantly described in the following.

In some embodiments, the depth D of the first recess R1 may be defined by the below-mentioned methods. First, after the first plane PSR is defined, the vertical distance between the first plane PSR and the upper surface S2 of the first base substrate SB1 may be defined as the height D1 (including the thickness of the circuit layer CL). Then, after the geometric center of the outline BO of the first recess R1 is defined, the vertical distance between the geometric center of the outline BO of the first recess R1 and the upper surface S2 of the first base substrate SB1 may be defined as the height D2. According to the present embodiment, the depth D of the first recess R1 may for example defined as the height D1 minus the height D2 (that is, depth D=height D1−height D2), but not limited thereto. The depth D of the first recess R1 of the present embodiment may be defined in any one of the above-mentioned definition methods according to the demands of the design, and the present disclosure is not limited thereto.

According to the present embodiment, the depth D of the first recess R1 may range from 0.01 μm to 10 μm (that is, 0.01 μm≤depthD≤10 μm), but not limited thereto. In some embodiments, the depth D of the first recess R1 may range from 0.5 μm to 5 μm (that is, 0.5 μm≤depthD≤5 μm). When the value of the depth D of the first recess R1 is lower than the above-mentioned range, the inner surface of the first substrate structure SBS1 may approximately be a plane due to the excessively small depth D of the first recess R1, or in other words, the first recess R1 may not have enough space for containing the adhesive layer AL, such that the adhesive layer AL may be squeezed and overflow during the adhering process of the first substrate structure SBS1 and the second substrate structure SBS2, resulting in the amount of the adhesive layer AL is excessively low, and peeling may occur. When the value of the depth D of the first recess R1 is greater than the above-mentioned range, the thickness of the adhesive layer AL may be excessively high, such that the possibility of sliding of the first substrate structure SBS1 and the second substrate structure SBS2 during alignment may be increased, thereby causing the misalignment between the first substrate structure SBS1 and the second substrate structure SBS2, that is, the offset alignment. In addition, when the value of the depth D of the first recess R1 is greater than the above-mentioned range, the amount of the adhesive layer AL may be excessively large, such that excessive bubbles may be generated during the curing process of the adhesive layer AL, thereby affecting the display effect of the display device 100. The range of the depth D of the first recess R1 in the present embodiment may be applied to each of the embodiments and variant embodiments of the present disclosure.

According to the present disclosure, the inner surface (that is, the upper surface S1 of the first insulating layer IL1) of the first substrate structure SBS1 may include the first recesses R1 to contain the adhesive layer AL, wherein the first insulating layer IL1 of the first substrate structure SBS1 may include any suitable shape or may be disposed in any shape as long as the inner surface of the first substrate structure SBS1 includes the first recesses R1, and the first recesses R1 may include any suitable shape according to the shape of the first insulating layer IL1, the present disclosure is not limited thereto. Other embodiments of the first recess R1 in the present disclosure will be detailed in the following.

Figure 5:
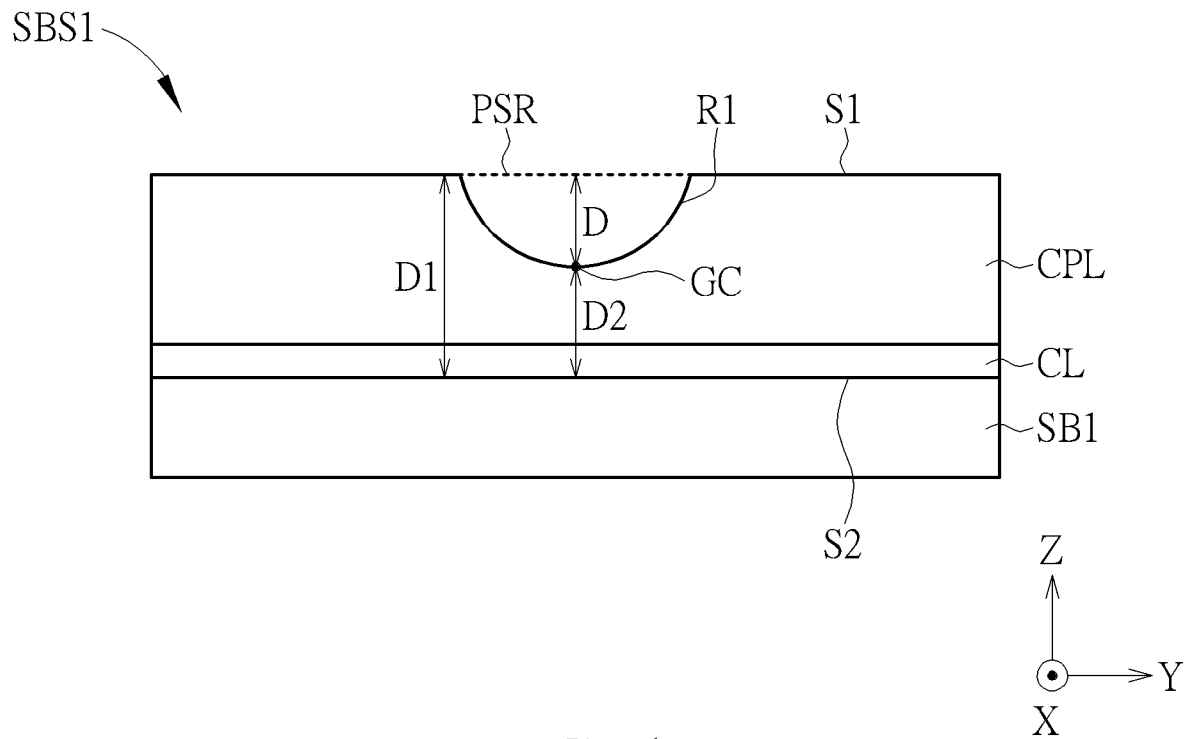
FIG. 5 schematically illustrates a cross-sectional view of a first recess according to a variant embodiment of the first embodiment of the present disclosure.

Referring to FIG. 5, FIG. 5 schematically illustrates a cross-sectional view of a first recess according to a variant embodiment of the first embodiment of the present disclosure. In order to simplify the figure, FIG. 5 just shows the first base substrate SB1, the circuit layer CL and the first recesses R1, and the recess base layer, the light emitting element and the first insulating layer are shown as a single layer (such as the layer CPL), but not limited thereto. The material and disposition of the elements and/or layers included in the first substrate structure SBS1 shown in FIG. 5 may refer to the contents mentioned above, and will not be redundantly described. One of the main differences between the present variant embodiment shown in FIG. 5 and the first embodiment shown in FIG. 1 is the design of the shape of the first recess R1. According to the present variant embodiment, as shown in FIG. 5, the first recess R1 may include an arc shape in a cross-sectional view of the first substrate structure SBS1, but not limited thereto. As shown in FIG. 5, the arc-shaped first recess R1 in the present variant embodiment may include the first plane PSR, wherein the first plane PSR may for example be coplanar with the inner surface (the upper surface S1) of the first substrate structure SBS1, but not limited thereto. In addition, since the first recess R1 includes the arc shape in a cross-section view of the first substrate structure SBS1 in the present variant embodiment, the geometric center of the outline of the first recess R1 may for example be defined as the lowest point (shown as the point GC in FIG. 5) of the first recess R1, but not limited thereto. After the first plane PSR of the first recess R1 and the geometric center of the outline of the first recess R1 are defined, the depth of the first recess R1 of the present variant embodiment may be defined according to the methods mentioned above. In detail, as shown in FIG. 5, the depth D of the first recess R1 may for example be defined as the vertical distance between the first plane PSR and the point GC, or, the vertical distance (height D1) between the first plane PSR and the upper surface S2 of the first base substrate SB1 and the vertical distance (height D2) between the point GC and the upper surface S2 of the first base substrate SB1 may be defined at first, and the depth D of the first recess R1 may be defined as the height D1 minus the height D2, but not limited thereto. The range of the depth D of the first recess R1 in the present variant embodiment may refer to the contents mentioned above, and will not be redundantly described here.

Figure 6:
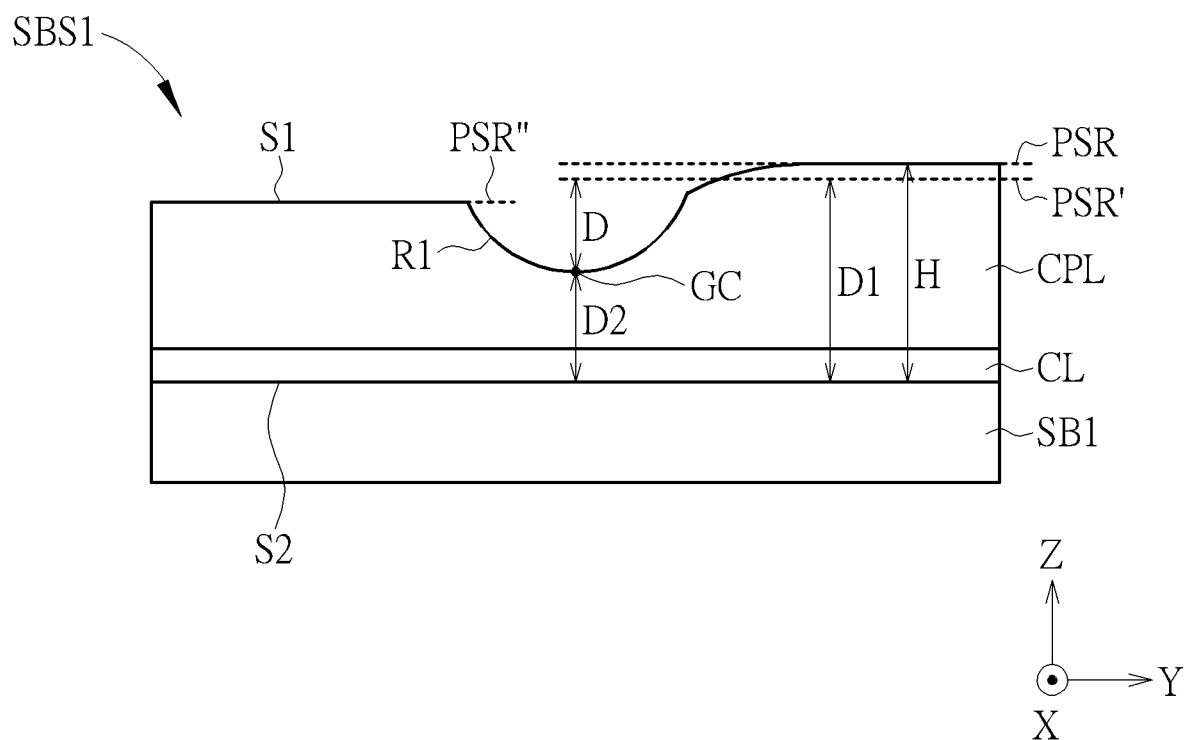
FIG. 6 schematically illustrates a cross-sectional view of a first recess according to another variant embodiment of the first embodiment of the present disclosure.

Referring to FIG. 6, FIG. 6 schematically illustrates a cross-sectional view of a first recess according to another variant embodiment of the first embodiment of the present disclosure. In order to simplify the figure, FIG. 6 just shows the first base substrate SB1, the circuit layer CL and the first recess R1, and the recess base layer, the light emitting element and the first insulating layer are shown as a single layer (such as the layer CPL), but not limited thereto. The material and disposition of the elements and/or layers included in the first substrate structure SBS1 shown in FIG. 6 may refer to the contents mentioned above, and will not be redundantly described. One of the main differences between the present variant embodiment shown in FIG. 6 and the first embodiment shown in FIG. 1 is the design of the shape of the first recess R1. According to the present variant embodiment, as shown in FIG. 6, the first recess R1 may include an irregular shape or an asymmetrical shape in a cross-sectional view of the first substrate structure SBS1, but not limited thereto. Since the first recess R1 includes an irregular shape or an asymmetrical shape in the present variant embodiment, the inner surface (the upper surface S1) of the first substrate structure SBS1 may for example include an irregular surface, but not limited thereto. As mentioned above, the depth D of the first recess R1 may for example be defined as the vertical distance between the highest horizontal plane of the first recess R1 and the geometric center of the outline of the first recess R1. However, in the present variant embodiment, the inner surface of the first substrate structure SBS1 may include an irregular surface, and a highest horizontal plane defined may be higher than the actual highest horizontal plane when defining the highest horizontal plane, such that the defined depth D of the first recess R1 may be different from the actual depth D of the first recess R1. Therefore, in the present variant embodiment, when the first recess R1 has an irregular shape in a cross-sectional view of the first substrate structure SBS1, or the inner surface of the first substrate structure SBS1 includes an irregular surface, a second plane may be defined based on the first plane, and the depth D of the first recess R1 may be defined as the vertical distance between the second plane and the geometric center of the outline of the first recess R1, but not limited thereto. In detail, as shown in FIG. 6, the first recess R1 of the first substrate structure SBS1 may include the first plane PSR, wherein a vertical distance H may be included between the first plane PSR and the upper surface S2 of the first base substrate SB1. After the vertical distance H is defined, the second plane PSR' may be defined, wherein the vertical distance (that is, the height D1) between the second plane PSR' and the upper surface S2 of the first base substrate SB1 is 0.95 times the vertical distance H (that is, height D1=0.95*vertical distance H). Then, as shown in FIG. 6, after the second plane PSR' is defined, the geometric center (the point GC) of the outline of the first recess R1 may be defined, and the depth D of the first recess R1 may be defined as the vertical distance between the second plane PSR' and the point GC in the present variant embodiment, but not limited thereto. Since the shape of the first recess R1 in the present variant embodiment is similar to the shape of the first recess R1 shown FIG. 5 (arc shape), the geometric center of the outline of the first recess R1 in the present variant embodiment may for example be the lowest point (point GC) of the first recess R1, but not limited thereto. In some embodiments, when the outline of the first recess R1 includes a bottom horizontal line (as shown in the first recess R1 in FIG. 1), the geometric center of the plane (or pattern) may be defined. In some embodiments, the vertical distance (height D1) between the second plane PSR' and the upper surface S2 of the first base substrate SB1 and the vertical distance (height D2) between the geometric center (point GC) of the outline of the first recess R1 and the upper surface S2 of the first base substrate SB1 may be defined at first, and the depth D of the first recess R1 may be defined as the height D1 minus the height D2, but not limited thereto.

In some embodiments, the inner surface of the first substrate structure SBS1 located at one side of the first recess R1 and the inner surface of the first substrate structure SBS1 located at the other side of the first recess R1 may have different heights in the cross-sectional view of the first substrate structure SBS1. For example, as shown in FIG. 6, the inner surface (such as the first plane PSR") of the first substrate structure SBS1 at the left side of the first recess R1 and the inner surface (such as the first plane PSR) of the first substrate structure SBS1 at the right side of the first recess R1 may have different heights, but not limited thereto. In such conditions, the depth D of the first recess R1 may for example be defined as the average of the depth defined based on the inner surface (such as the first plane PSR") of the first substrate structure SBS1 at the left side of the first recess R1 and the depth defined based on the inner surface (such as the first plane PSR) of the first substrate structure SBS1 at the right side of the first recess R1, but not limited thereto. In detail, as shown in FIG. 6, the depth defined based on the inner surface (such as the first plane PSR) of the first substrate structure SBS1 at the right side of the first recess R1 may for example be the depth D, another depth (not shown in FIG. 6) may be defined based on the inner surface (such as the first plane PSR") of the first substrate structure SBS1 at the left side of the first recess R1, and the depth of the first recess may be defined as the average of the two depths mentioned above. The definition method of the depth D of the first recess R1 in the present variant embodiment may be applied to each of the embodiments and variant embodiments of the present disclosure.

It should be noted that the shapes of the first recesses R1 shown in FIGS. 1, 5 and 6 are just exemplary, and the present disclosure is not limited thereto. In some embodiments, the first recess R1 may include any suitable shape according to the demands of the design, and the depth D of the first recess R1 may be defined by the definition methods in the above-mentioned embodiments and variant embodiments according to the actual shape of the first recess R1. In some embodiments, when the first recess R1 includes the outline with a horizontal section in the cross-sectional view of the first substrate structure SBS1, the geometric center of the outline of the first recess R1 may be defined with reference to the method described in the related description of FIG. 1; in some embodiments, when the first recess R1 has an arc shape without an outline in the cross-sectional view of the first substrate structure SBS1, the geometric center of the outline of the first recess R1 may be defined with reference to the methods described in the related descriptions of FIGS. 5 and 6; in some embodiments, when the outer edge of the first recess R1 has an irregular shape or an irregular surface in the cross-sectional view of the first substrate structure SBS1, and the heights of the sidewalls of both sides of the first recess R1 are not exactly the same, the average of the depths of the first recess R1 may be defined with reference to the method described in the related descriptions of FIG. 6, but not limited thereto. The definition methods of the depth D of the first recess R1 in the present embodiment and variant embodiment may be applied to each of the embodiments and variant embodiments of the present disclosure.

Other embodiments of the present disclosure will be described in the following. In order to simplify the description, the same layers or elements in the following embodiments would be labeled with the same symbol, and the features thereof will not be redundantly described. The differences between the embodiments will be detailed in the following.

Figure 7:
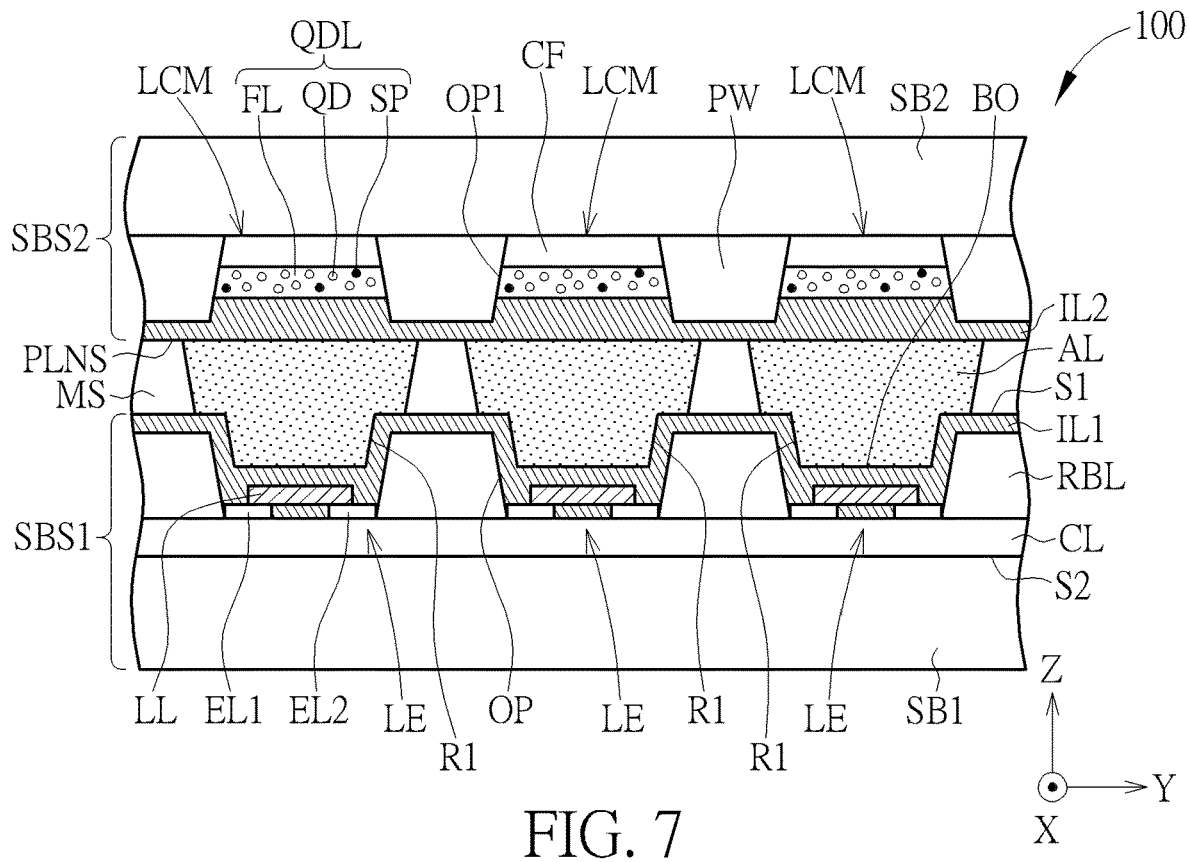
FIG. 7 schematically illustrates a cross-sectional view of a display device according to a second embodiment of the present disclosure.

Referring to FIG. 7, FIG. 7 schematically illustrates a cross-sectional view of a display device according to a second embodiment of the present disclosure. According to the present embodiment, other elements and/or layers may further be included between the first substrate structure SBS1 and the second substrate structure SBS2 of the display device 100, but not limited thereto. In detail, as shown in FIG. 7, the display device 100 may further include at least one micro structure MS disposed between the first substrate structure SBS1 and the second substrate structure SBS2, or in other words, the micro structure MS may be disposed between the first insulating layer IL1 of the first substrate structure SBS1 and the second insulating layer IL2 of the second substrate structure SBS2, but not limited thereto. In the present embodiment, the micro structure MS may for example include photo spacer, other suitable elements or combinations of the above-mentioned elements, but not limited thereto. In some embodiments, when the light emitting element LE of the first substrate structure SBS1 includes an organic light emitting diode, the micro structure MS may include an auxiliary electrode disposed between the first substrate structure SBS1 and the second substrate structure SBS2, that is, the micro structure MS may include conductive materials, but not limited thereto. The elements and/or layers included in the first substrate structure SBS1 and the second substrate structure SBS2 of the present embodiment may refer to the above-mentioned contents, and will not be redundantly described. According to the present embodiment, since the inner surface (such as the upper surface S1) of the first substrate structure SBS1 may include the first recesses R1, it can provide a containing space for the adhesive layer AL, thereby reducing the condition that the frame glue DW is broken due to squeeze of the adhesive layer AL during the adhering process. In addition, although the display device 100 of the present embodiment may include micro structures MS, the disposition of the micro structures MS may not affect the containing function of the first recess R1. For example, as shown in FIG. 7, the micro structures MS of the present embodiment may not be disposed corresponding to the first recesses R1, or in other words, the micro structures MS may not be disposed in the first recesses R1 in a top view direction (such as direction Z) of the display device 100. For example, the micro structures MS may be disposed on the surface of the patterned recess base layer RBL to reduce the influence of the micro structures MS on the containing function of the first recess R1, but not limited thereto. The feature that the display device 100 includes the micro structures MS in the present embodiment may be applied to each of the embodiments and variant embodiments of the present disclosure.

Referring to FIG. 8, FIG. 8 schematically illustrates a cross-sectional view of a display device according to a third embodiment of the present disclosure. According to the present embodiment, the display device 100 may further include recesses located at the second substrate structure SBS2 in addition to the first recesses R1 located at the first substrate structure SBS1, but not limited thereto. For example, as shown in FIG. 8, the second substrate structure SBS2 of the display device 100 may further include at least one second recess R2, wherein the second recess R2 may for example be formed of the second insulating layer IL2 of the second substrate structure SBS2, but not limited thereto. In detail, the second recess R2 of the present embodiment may for example be formed through the method described in the following. First, after the light converting element LCM and the partition walls PW are disposed on the second base substrate SB2, an uneven structure may thereby be formed, wherein the structure may include the openings OP1 defined by the partition walls PW, as mentioned above, but not limited thereto. Then, the second insulating layer IL2 may be disposed on the uneven structure, wherein the second insulating layer IL2 may be conformally disposed on the uneven structure and form an uneven surface S3, instead of the flat plane PLNS shown in FIG. 3. As shown in FIG. 8, the level difference of the uneven surface S3 of the second insulating layer IL2 may include at least one second recess R2, and the second recess R2 may correspond to the opening OP1, but not limited thereto. That is, the second insulating layer IL2 of the present embodiment may form the second recesses R2 corresponding to the openings OP1, or in other words, the surface S3 of the second insulating layer IL2 may form the second recesses R2 corresponding to the first recesses R1. It should be noted that although the second insulating layer IL2 shown in FIG. 8 is conformally formed on the uneven structure to form the second recess R2, the present disclosure is not limited thereto. In some embodiments, the second insulating layer IL2 may be disposed in any suitable shape as long as the surface S3 of the second insulating layer IL2 can form the second recesses R2. The definition and the range of the depth of the second recess R2 in the present embodiment may refer to the descriptions of the first recess R1, and will not be redundantly described. In addition, in the present embodiment, as mentioned above, the light converting element LCM may be disposed in the openings OP1 defined by the partition walls PW, and the second recesses R2 are formed of the second insulating layer IL2 corresponding to the openings OP1. Therefore, the second recesses R2 of the present embodiment may for example correspond to the light converting element LCM, as shown in FIG. 8, but not limited thereto. According to the present embodiment, when the first substrate structure SBS1 is to be adhered to the second substrate structure SBS2 to form the display device 100, since the inner surface (that is, the upper surface S1) of the first substrate structure SBS1 in contact with the adhesive layer AL and the inner surface (that is, the surface S3 of the second insulating layer IL2) of the second substrate structure SBS2 in contact with the adhesive layer AL may respectively include the first recesses R1 and the second recesses R2, a part of the adhesive layer AL may be filled in the first recesses R1 and/or the second recesses R2 to reduce the condition that the frame glue (such as the frame glue DW shown in FIG. 4) is broken due to squeeze of the adhesive layer AL during the adhering process, thereby reducing the possibility that the subsequent cutting process or bonding process are affected. It should be noted that although the display device 100 shown in FIG. 8 includes the first recesses R1 and the second recesses R2, the present disclosure is not limited thereto. In some embodiments, the display device 100 may include the second recess R2 located at the second substrate structure SBS2 but not include the first recess R1 located at the first substrate structure SBS1, and during the adhering process of the first substrate structure SBS1 and the second substrate structure SBS2, a part of the adhesive layer AL may be filled in the second recesses R2, but not limited thereto. The feature that the display device 100 includes the first recesses R1 and the second recesses R2 in the present embodiment may be applied to each of the embodiments and variant embodiments of the present disclosure.

Figure 9:
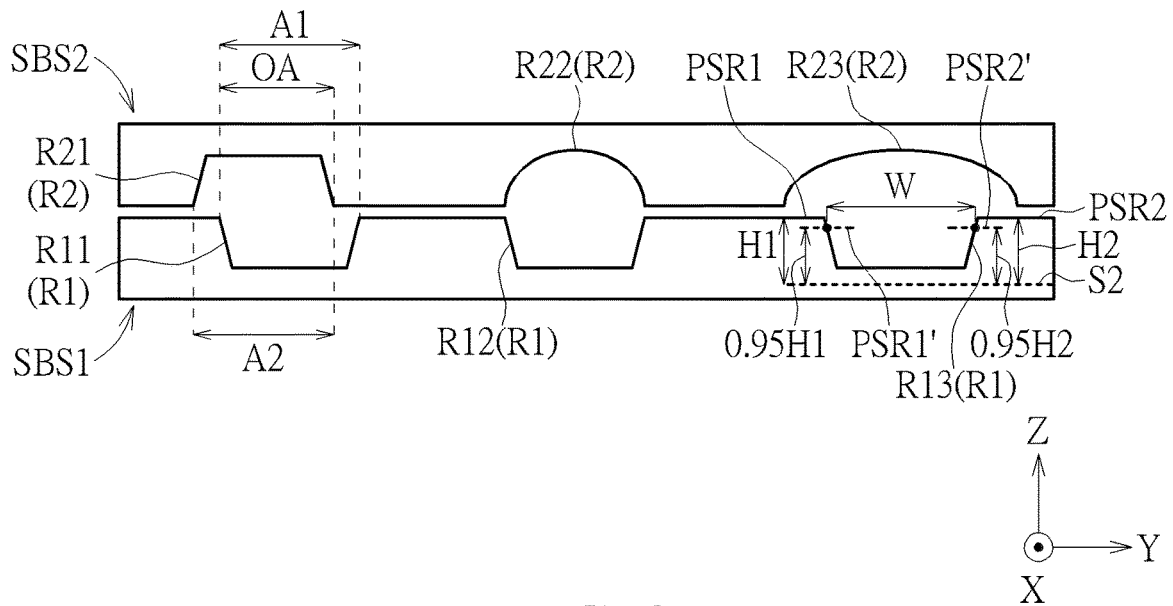
FIG. 9 schematically illustrates a cross-sectional view of first recesses and second recesses according to a variant embodiment of the third embodiment of the present disclosure.

Referring to FIG. 9, as long as FIG. 8, FIG. 9 schematically illustrates a cross-sectional view of first recesses and second recesses according to a variant embodiment of the third embodiment of the present disclosure. In order to simplify the figure, the first substrate structure SBS1 and the second substrate structure SBS2 are shown as a single layer in FIG. 9, but not limited thereto. According to the present embodiment, the first recesses R1 of the first substrate structure SBS1 may for example correspond to the second recesses R2 of the second substrate structure SBS2. Specifically, each of the first recesses R1 may for example correspond to one second recess R2, but not limited thereto. "The first recess R1 correspond to the second recess R2" mentioned above may represent that the first recess R1 is overlapped with the corresponding second recess R2 in a top view direction (direction Z) of the display device 100 in the present embodiment. For example, when viewing a cross-section of a panel after embedding apart of the panel and grinding the panel, the first recess R1 may at least partially be overlapped with the second recess R2, but not limited thereto. For example, as shown in FIG. 8, since each of the first recesses R1 shown in FIG. 8 is substantially overlapped with a second recess R2 in the top view direction (direction Z) of the display device 100, each of the first recesses R1 shown in FIG. 8 may be regarded to be corresponding to the second recess R2 which it is overlapped with, but not limited thereto. In some embodiments, when the number of the first recesses R1 is greater than the number of the second recesses R2, a part of the first recesses R1 may not correspond to the second recesses R2; in some embodiments, when the number of the second recesses R2 is greater than the number of the first recesses R1, apart of the second recesses R2 may not correspond to the first recesses R1, but not limited thereto.

It should be noted that "the first recess R1 is overlapped with the second recess R2" mentioned above may include the condition of partial overlap in the present embodiment, and the corresponding relation between the first recesses R1 and the second recesses R2 shown in FIG. 8 is just exemplary, the present disclosure is not limited thereto. In detail, according to the present embodiment, when the overlapping area of the projection of the first recess R1 on a plane (such as the X-Y plane, but not limited thereto) perpendicular to the top view direction (direction Z) of the display device 100 and the projection of the second recess R2 on the plane perpendicular to the top view direction of the display device 100 is greater than 50% of the greater projected area among the projected area of the first recess R1 on the plane perpendicular to the top view direction of the display device 100 and the projected area of the second recess R2 on the plane perpendicular to the top view direction of the display device 100, the first recess R1 may be regarded to be corresponding to the second recess R2, but not limited thereto. For example, as shown in FIG. 9, the first recess R11 may for example have a projected area A1 on a plane perpendicular to the top view direction of the display device 100, the second recess R21 may for example have a projected area A2 on a plane perpendicular to the top view direction of the display device 100, and the projection of the first recess R11 and the projection of the second recess R21 may for example have an overlapping area OA. According to the present embodiment, when the projected area A1 is greater than the projected area A2, and the overlapping area OA is greater than 50% of the projected area A1, the first recess R11 may be regarded to be corresponding to the second recess R21, or, when the projected area A2 is greater than the projected area A1, and the overlapping area OA is greater than 50% of the projected area A2, the first recess R11 may be regarded to be corresponding to the second recess R21, but not limited thereto. The corresponding relationship between the first recesses R1 and the second recesses R2 described in FIG. 8 and FIG. 9 may be applied to each of the embodiments and variant embodiments of the present disclosure.

In the present variant embodiments, the first recess R1 and the second recess R2 corresponding to each other may respectively have any suitable shape, and the first recess R1 and the corresponding second recess R2 may have different shapes, the present disclosure is not limited thereto. For example, as shown in FIG. 9, the first recess R12 may correspond to the second recess R22, wherein the shape of the first recess R12 may be different from the shape of the second recess R22, but not limited thereto.

In the present variant embodiment, the first recess R1 and the second recess R2 corresponding to each other may respectively have any suitable size, and the first recess R1 and the corresponding second recess R2 may have different sizes, the present disclosure is not limited thereto. For example, as shown in FIG. 9, the first recess R13 may correspond to the second recess R23, wherein the shape of the first recess R13 and the shape of the second recess R23 may be different, but not limited thereto. According to the present embodiment, "the size of the first recess R1 and the size of the second recess R2" mentioned above may respectively represent the volume of the first recess R1 and the volume of the second recess R2, but not limited thereto. In the following, the first recess R13 shown in FIG. 9 is taken as an example for illustrating the definition method of the volume of the recesses (first recesses R1 and second recesses R2) of the present disclosure. First, the shape (as shown in FIG. 9) of the first recess R13 in the cross-section of the first substrate structure SBS1 may be defined at first, wherein the definition of the cross-section of the first substrate structure SBS1 may refer to the above-mentioned contents, and will not be redundantly described. After the shape of the cross-section of the first recess R13 is confirmed (such as the trapezoid shown in FIG. 9, but not limited thereto), the first plane PSR1 at the left side of the first recess R13 and the first plane PSR2 at the right side of the first recess R13 may respectively be defined according to the contents in the above-mentioned embodiments, and the second plane PSR1' and the second plane PSR2' may be defined respectively based on the first plane PSR1 and the first plane PSR2. In detail, as mentioned above, when a vertical distance H1 is included between the first plane PSR1 and the upper surface S2 of the first base substrate (FIG. 9 just exemplarily marks the upper surface S2 of the first base substrate), the vertical distance between the second plane PSR1' and the upper surface S2 is 0.95 times the vertical distance H1 (that is, 0.95*vertical distance H1); when a vertical distance H2 is included between the first plane PSR2 and the upper surface S2 of the first base substrate, the vertical distance between the second plane PSR2' and the upper surface S2 is 0.95 times the vertical distance H2 (that is, 0.95*vertical distance H2). Therefore, after the first plane PSR1 and the first plane PSR2 are confirmed, the second plane PSR1' and the second plane PSR2' may be defined respectively based on the first plane PSR1 and the first plane PSR2. After the second plane PSR1' and the second plane PSR2' are defined, the intersection point C1 of the first recess R13 and the second plane PSR1' and the intersection point C2 of the first recess R13 and the second plane PSR2' may thereby be defined, and the distance between the intersection point C1 and the intersection point C2 in a direction parallel to the surface of the first base substrate SB1 (that is, the direction Y, but not limited thereto) may be defined as the characteristic length W of the first recess R13, but not limited thereto. It should be noted that the vertical distance H1 and the vertical distance H2 shown in FIG. 9 may be the same or different, the present disclosure is not limited thereto. After the characteristic length W of the first recess R13 is defined, the volume of the first recess R13 may be calculated according to the shape of the first recess R13. For example, in some embodiments, when the first recess R13 is similar to a cube, the volume of the first recess R13 may for example be $W^2D$; in some embodiments, when the first recess R13 is similar to a cylinder, the volume of the first recess R13 may for example be $W^2/4*\pi*D$, wherein D is the depth of the first recess R13, and the definition of the depth D of the first recess R13 may refer to the contents mentioned above, and will not be redundantly described. The sizes of the first recess R1 and/or the second recess R2 of the present disclosure may be defined according to the method mentioned above.

Figure 10:
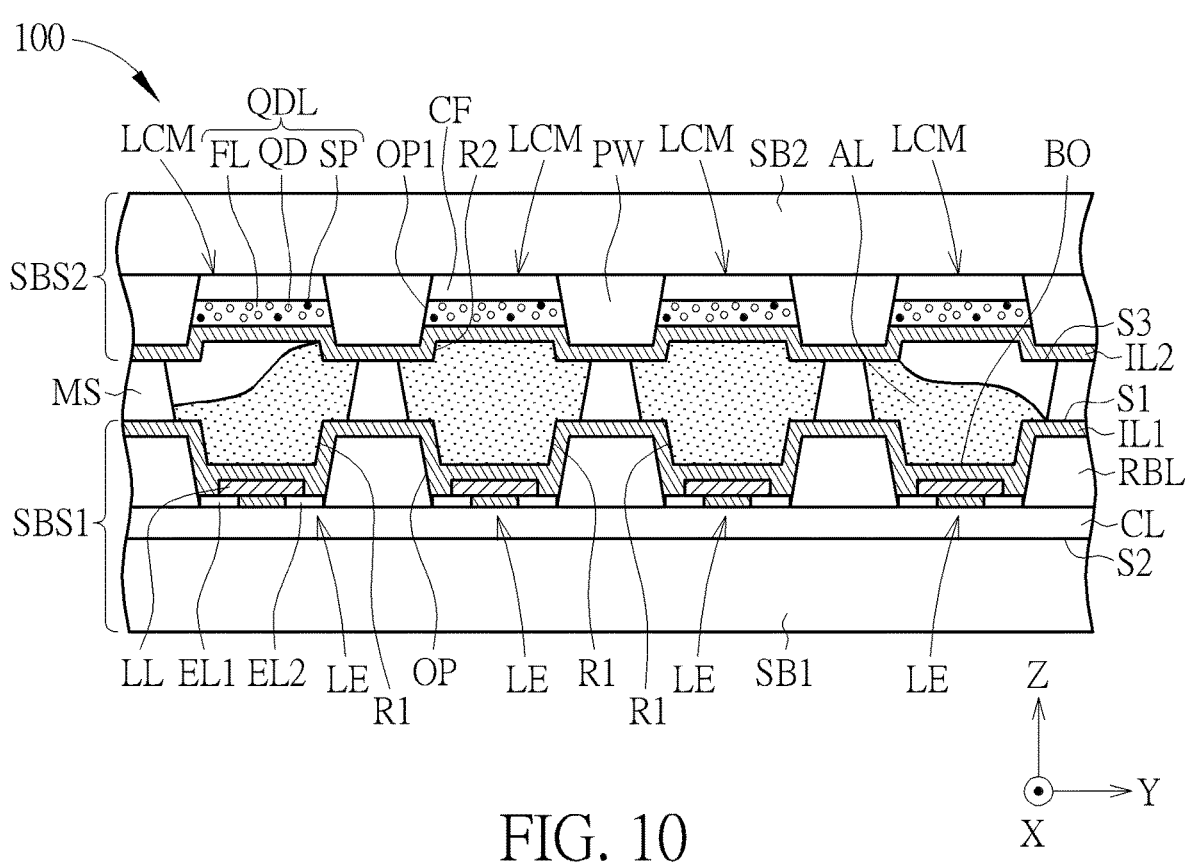
FIGS. 10, 11 and 12 schematically illustrate a cross-sectional view of a display device according to a fourth embodiment of the present disclosure.
Figure 11:
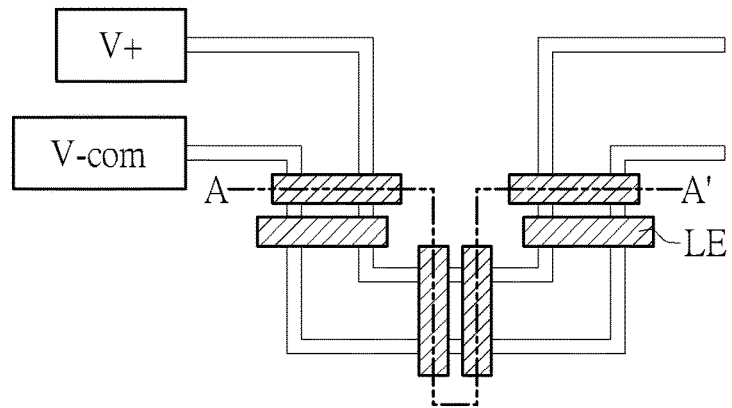
Figure 12:
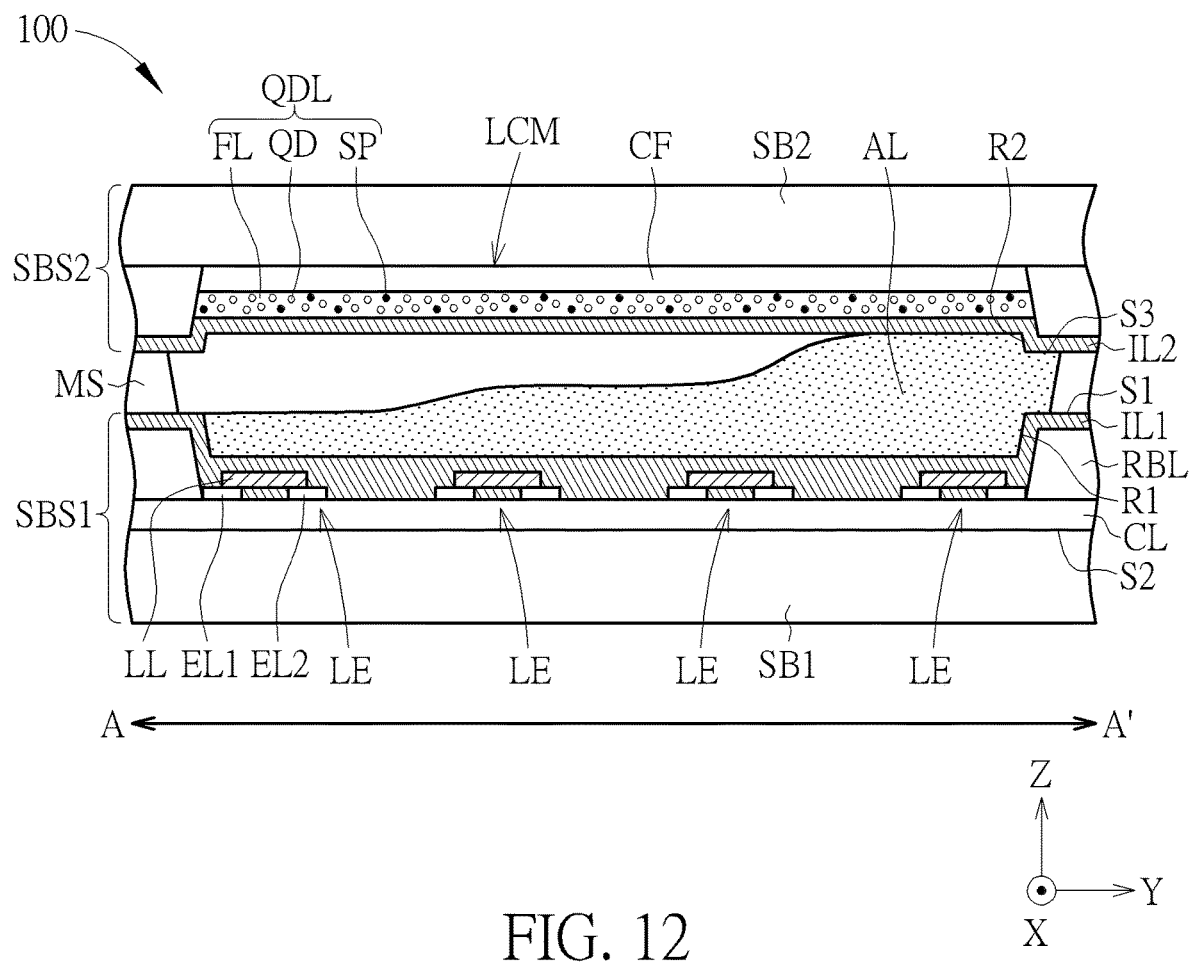

Referring to FIGS. 10, 11 and 12, FIGS. 10, 11 and 12 schematically illustrate a cross-sectional view of a display device according to a fourth embodiment of the present disclosure, wherein FIG. 11 shows the structure that a plurality of light emitting elements LE is disposed in a single first recess R1 of the first substrate structure SBS1, and FIG. 12 shows the cross-section of the structure shown in FIG. 11 along a section line A-A'. In order to simplify the figure, FIG. 11 only shows the light emitting elements LE and the arrangement thereof, and other elements and/or layers are omitted, but not limited thereto. As mentioned above, the first recesses R1 and/or the second recesses R2 of the present disclosure may provide a space for containing the adhesive layer AL, thereby reducing the possibility that the frame glue is broken due to squeeze of the adhesive layer AL during the adhering process. Therefore, in the present embodiment, the adhesive layer AL may be designed to be filled in at least one of the first recess R1 and/or the second recess R2 to reduce the problem that the frame glue is broken due to squeeze of the adhesive layer AL during the adhering process. In order to achieve the above-mentioned goal, the adhesive layer AL may be disposed in the first recesses R1 and/or the second recesses R2 in any distribution way. In some embodiment, the adhesive layer AL does not need to be completely filled in all of the first recesses R1 and/or the second recesses R2, but not limited thereto. For example, as shown in FIGS. 10 and 12, after the first substrate structure SBS1 is adhered to the second substrate structure SBS2, a part of the first recesses R1 and/or second recesses R2 (such as the second recess R2 at the left side shown in FIG. 10 and the second recess R2 shown in FIG. 12) may include the partially filled adhesive layer AL, or in other words, the adhesive layer AL may not completely be filled in the part of the first recesses R1 and/or the second recesses R2, but not limited thereto. Or, in some embodiments, a part of the first recesses R1 and/or the second recesses R2 may not include the adhesive layer AL, but not limited thereto. For example, the second recess R2 at the right side shown in FIG. 10 may not include the adhesive layer AL, but not limited thereto. In addition, as mentioned above, a single first recess R1 of the first substrate structure SBS1 of the present disclosure may for example include more than one light emitting elements LE. For example, as shown in FIGS. 11 and 12, FIG. 11 shows the arrangement of the light emitting elements LE in a single first recess R1, wherein the plurality of light emitting elements LE shown in FIG. 11 may be connected in parallel and be connected to a voltage V+ and a common voltage V-com, but not limited thereto. The distribution of the adhesive layer AL in the first recesses R1 and/or the second recesses R2 in the present embodiment may be applied to the each of the embodiments and variant embodiments of the present disclosure.

In addition, although the bottom of the first recess R1 (or the upper surface of the first insulating layer IL1 corresponding to the bottom of the first recess R1) includes a flat structure, the present disclosure is not limited thereto. In some embodiments, the upper surface of the first insulating layer IL1 corresponding to the bottom of the first recess R1 may include an uneven structure such as a wavy structure with ups and downs according to the shape of the light emitting elements LE, but not limited thereto. The feature that the upper surface of the first insulating layer IL1 corresponding to the bottom of the first recess R1 includes an uneven structure may be applied to each of the embodiments and variant embodiments of the present disclosure.

Figure 13:
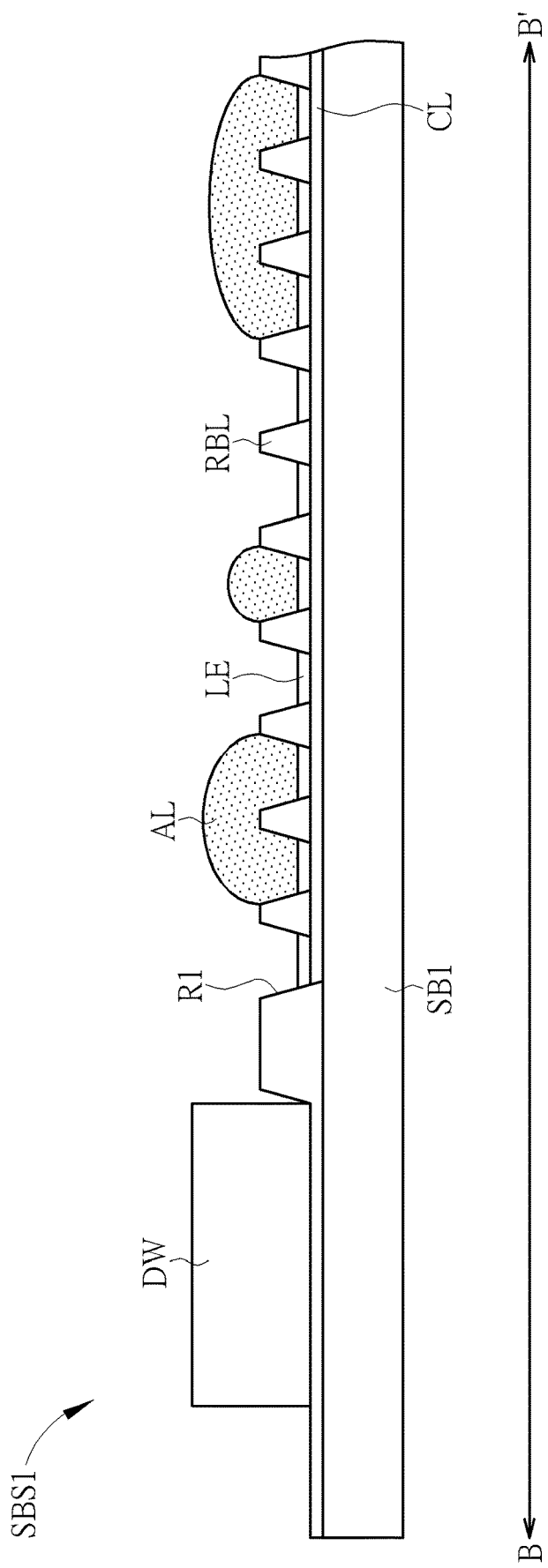
FIGS. 13 and 14 schematically illustrate the disposition of an adhesive layer according to a fifth embodiment of the present disclosure.
Figure 14:
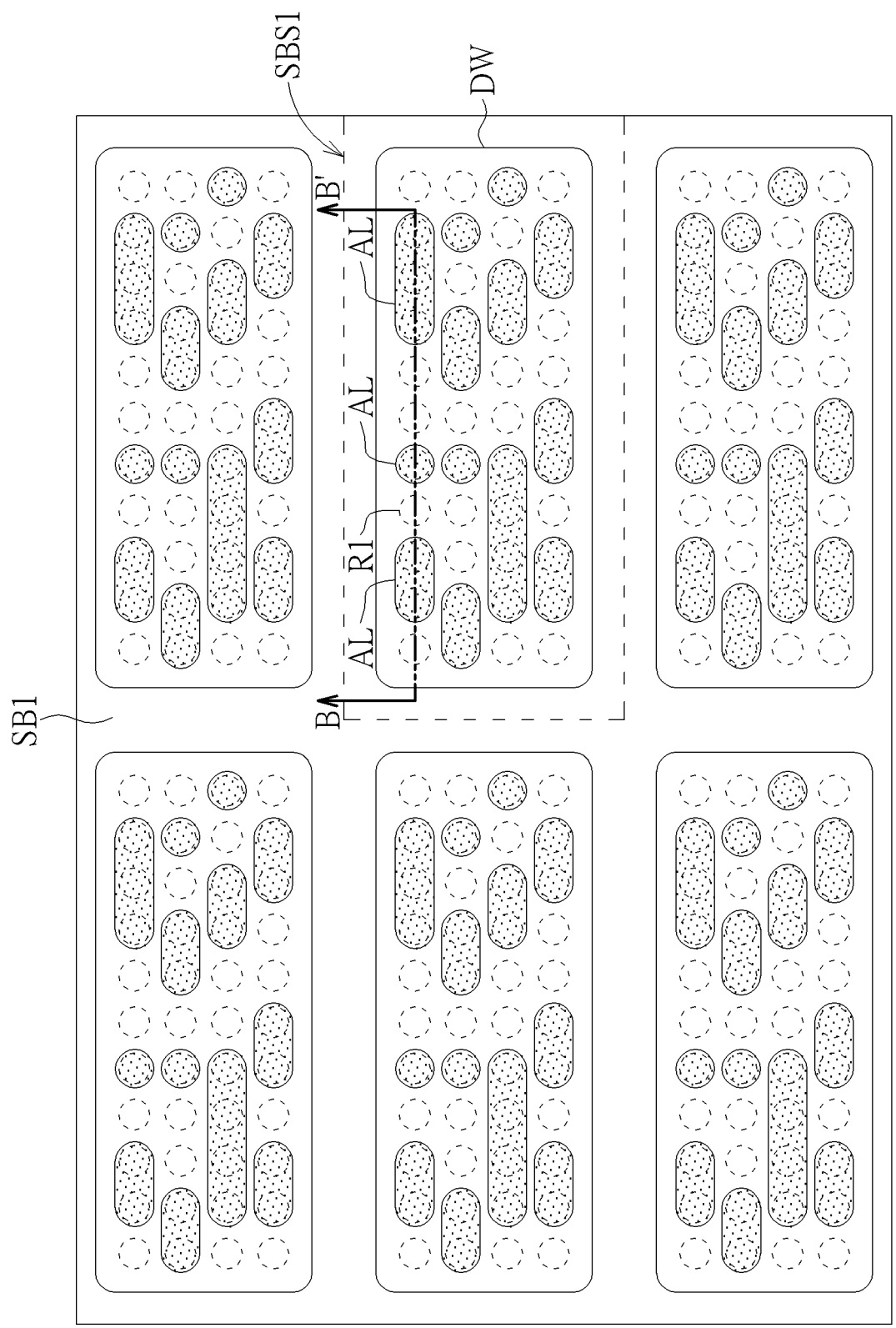

Referring to FIGS. 13 and 14, FIGS. 13 and 14 schematically illustrate the disposition of an adhesive layer according to a fifth embodiment of the present disclosure, wherein FIG. 14 shows a top view of a structure that the adhesive layer AL is disposed on the first substrate structure SBS1, and FIG. 13 is a cross-section of the structure shown in FIG. 14 along a section line B-B'. In order to simplify the figure, the light emitting elements LE are shown as a single layer in FIG. 13, and the first insulating layer is omitted in FIG. 13. In addition, FIG. 14 only shows the first base substrate SB1, the adhesive layer AL, the first recess R1 and the frame glue DW, and other elements and/or layers are not shown. As mentioned above, the display device 100 of the present disclosure may be formed by adhering the first substrate structure SBS1 and the second substrate structure SBS2 through the adhesive layer AL, and according to the present embodiment, the material of the adhesive layer AL (such as water glue) may for example be disposed on one of the first substrate structure SBS1 and the second substrate structure SBS2 which includes the recess structure before adhering the first substrate structure SBS1 to the second substrate structure SBS2, but not limited thereto. That is, when the first substrate structure SBS1 includes the first recesses R1, and the second substrate structure SBS2 does not include the second recess R2, the adhesive layer material (shown as the adhesive layer AL in FIGS. 13 and 14) may be disposed on the first substrate structure SBS1; when the first substrate structure SBS1 does not include the first recess R1, and the second substrate structure SBS2 includes the second recesses R2, the adhesive layer material may be disposed on the second substrate structure SBS2; when the first substrate structure SBS1 includes the first recesses R1, and the second substrate structure SBS2 includes the second recesses R2, the adhesive layer material may be disposed on the first substrate structure SBS1 or the second substrate structure SBS2, but not limited thereto. In detail, the forming method of the display device 100 of the present embodiment may for example include the following steps. First, as shown in FIG. 14, the first substrate structure SBS1 having the first recesses R1 (or the second substrate structure SBS2 having the second recesses R2) may be provided, wherein the forming method of the first substrate structure SBS1 may refer to the contents mentioned above, and will not be redundantly described. It should be noted that FIG. 14 shows the structure that a plurality of first substrate structures SBS1 (for example, FIG. 14 shows six first substrate structures SBS1, but not limited thereto) include the same first base substrate SB1 as a mother board, and the structure may be divided into a plurality of display devices 100 in the subsequent cutting process, but not limited thereto. Then, the frame glue DW with a closed shape may be formed on the first base substrate SB1, wherein the frame glue DW may define the disposition range of the adhesive layer material on the first substrate structure SBS1 in the subsequent process, but not limited thereto. In the present embodiment, the viscosity of the frame glue DW may be greater than the viscosity of the adhesive layer material, such that the possibility of flow of the frame glue DW during the manufacturing process of the display device 100 may be reduced. In detail, the viscosity of the frame glue DW of the present embodiment may for example range from 600,000 to 1,000,000 cps (that is, 600,000 cps≤viscosity≤1,000,000 cps), but not limited thereto. After the frame glue DW is disposed, the adhesive layer material may be disposed in the region enclosed by the frame glue DW. According to the present embodiment, the adhesive layer material may be disposed on any suitable position of the first substrate structure SBS1 (or the second substrate structure SBS2), and the disposition position thereof may be adjusted according to the demands of the process. For example, as shown in FIGS. 13 and 14, the adhesive layer material may be randomly disposed on the first substrate structure SBS1 in the region enclosed by the frame glue DW, and the present disclosure is not limited thereto. In the present embodiment, the adhesive layer material may for example be disposed on the first substrate structure SBS1 through the drop filling process, the slot-die coating process or other suitable processes, but not limited thereto. Since the inner surface of the first substrate structure SBS1 includes the first recesses R1, when the adhesive layer material is disposed on the first substrate structure SBS1, it may be filled in a part of the first recesses R1, as shown in FIG. 13, but not limited thereto. After the adhesive layer material is disposed on the first substrate structure SBS1, steps such as soft bake, alignment, adhering, post bake, etc. may be performed to form the display device 100, wherein the adhesive layer material disposed on the first substrate structure SBS1 may flow due to being squeezed by the first substrate structure SBS1 and the second substrate structure SBS2 in the adhering step. However, since the first substrate structure SBS1 of the present embodiment may include the first recesses R1, when the adhesive layer material flows due to being squeezed, the adhesive layer material may flow into the containing space provided by the first recesses R1, such that the adhesive layer AL is less likely to squeeze and break the frame glue DW and overflow, thereby improving the yield of the display device 100. It should be noted that although FIGS. 13 and 14 show the structure that the adhesive layer material is disposed on the first substrate structure SBS1, the present disclosure is not limited thereto. In some embodiments, the adhesive layer material may be disposed on the second substrate structure SBS2 including the second recesses R2 at first, and the second substrate structure SBS2 can be adhered to the first substrate structure SBS1 to form the display device 100. The disposition of the adhesive layer material in the present embodiment may be applied to each of the embodiments and variant embodiments of the present disclosure.

In summary, the display device including the first substrate structure, the second substrate structure and the adhesive layer for adhering the first substrate structure and the second substrate structure is provided by the present disclosure. Since the surfaces of the first substrate structure and/or the second substrate structure in contact with the adhesive layer may include the recess structure, the possibility that the frame glue in the peripheral region is broken due to squeeze of the adhesive layer AL during the adhering process may be reduced, and the subsequent cutting process or bonding process may be improved, thereby improving the yield of the display device.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:
1. A display device, comprising:
 a first substrate structure having a first recess, comprising:
  a first base substrate;
  a recess base layer disposed on the first base substrate and having an opening;
  a light emitting element disposed on the first base substrate and located in the opening of the recess base layer; and
  a first insulating layer disposed on the recess base layer and the light emitting element and covering the light emitting element, wherein the first insulating layer forms the first recess;
 a second substrate structure disposed opposite to the first substrate structure; and
 an adhesive layer sandwiched between the first substrate structure and the second substrate structure,
 wherein a part of the adhesive layer is filled in the first recess.

2. The display device as claimed in claim 1, wherein a depth of the first recess is greater than or equal to 0.01 μm and less than or equal to 10 μm.

3. The display device as claimed in claim 1, wherein a depth of the first recess is greater than or equal to 0.5 μm and less than or equal to 5 μm.

4. The display device as claimed in claim 1, wherein the second substrate structure comprises a second recess and a part of the adhesive layer is filled in the second recess.

5. The display device as claimed in claim 4, wherein the second recess is corresponding to the first recess.

6. The display device as claimed in claim 4, wherein the second substrate structure comprises a second base substrate, a second insulating layer and a light converting element which is disposed between the second base substrate and the second insulating layer.

7. The display device as claimed in claim 6, wherein the second insulating layer forms the second recess and the light converting element is corresponding to the second recess.

8. The display device as claimed in claim 6, wherein the light converting element comprise quantum dots.

9. The display device as claimed in claim 1, wherein the light emitting element is disposed between the first base substrate and the first insulating layer.

10. The display device as claimed in claim 9, wherein the light emitting element is corresponding to the first recess.

11. The display device as claimed in claim 9, wherein the light emitting element is a bar light emitting diode.

* * * * *